United States Patent [19]

Hagino et al.

[11] Patent Number: 5,574,398

[45] Date of Patent: Nov. 12, 1996

[54] ACTIVE BANDPASS FILTER

[75] Inventors: Hideyuki Hagino, Kumagaya; Michiro Yokote, Yokohama, both of Japan

[73] Assignee: Kabushiki Kaisha Toshiba, Kawasaki, Japan

[21] Appl. No.: 488,052

[22] Filed: Jun. 7, 1995

[30] Foreign Application Priority Data

Aug. 1, 1994 [JP] Japan .................................. 6-180310

[51] Int. Cl.$^6$ .............................. H03K 5/00; H03H 11/08
[52] U.S. Cl. ......................... 327/557; 327/551; 327/552; 330/306; 330/303
[58] Field of Search ..................................... 327/557, 551, 327/552, 553, 554, 555, 556, 558, 559; 330/303, 305, 306

[56] References Cited

FOREIGN PATENT DOCUMENTS 1-67015  3/1989  Japan .
6-283965 10/1994 Japan .

OTHER PUBLICATIONS

"24 Active Filters–A Wide Choice For The Designer", Electronics, vol. 42, No. 15, Jul. 21, 1969.

*Primary Examiner*—Timothy P. Callahan
*Assistant Examiner*—Dinh T. Le
*Attorney, Agent, or Firm*—Oblon, Spivak, McClelland, Maier & Neustadt, P.C.

[57] ABSTRACT

An active bandpass filter offers freely settable values of quality factor Q and peak gain. The active bandpass filter has a first transistor, the base of which is connected to an input terminal of the filter via a first capacitance element, the collector of which is connected to a first constant voltage source, and the emitter of which is connected to a first constant current source or a resistance element. The active bandpass filter also has a second transistor, the base of which is connected both to a second constant voltage source via a first resistance element and to the emitter of the first transistor via a second capacitance element, the collector of which is connected both to an output terminal of the filter and, via a second resistance element, to the first constant voltage source, and the emitter of which is connected both to the base of the first transistor via a third resistance element, and also to a second constant current source or a resistance element.

5 Claims, 2 Drawing Sheets

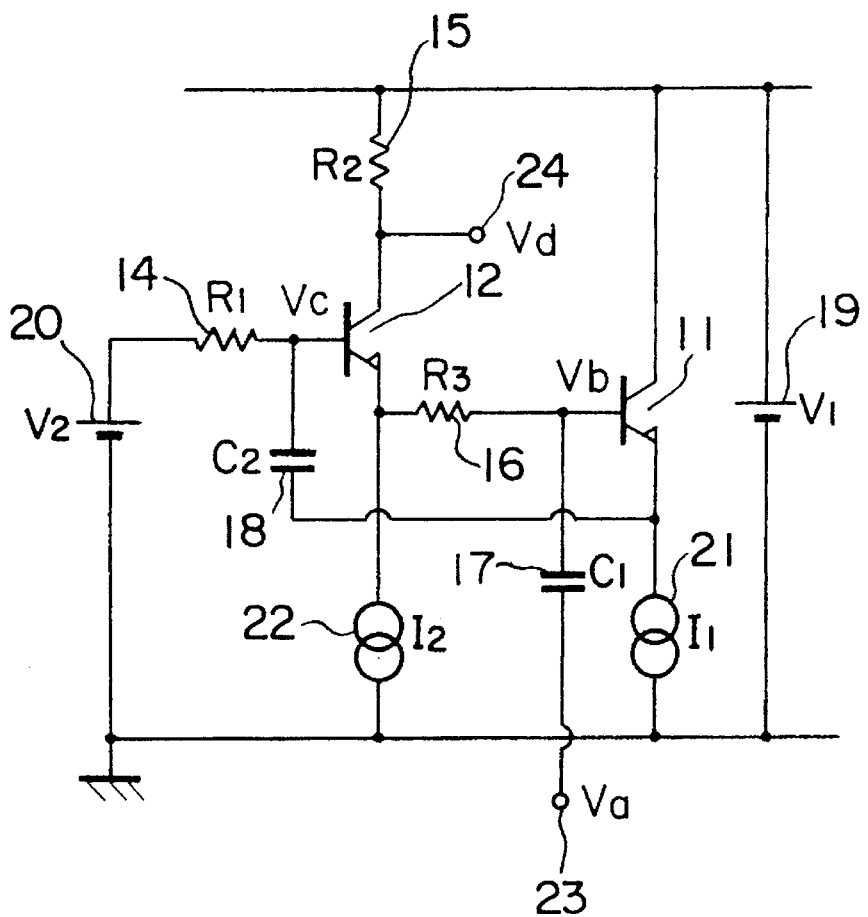
F I G. 2

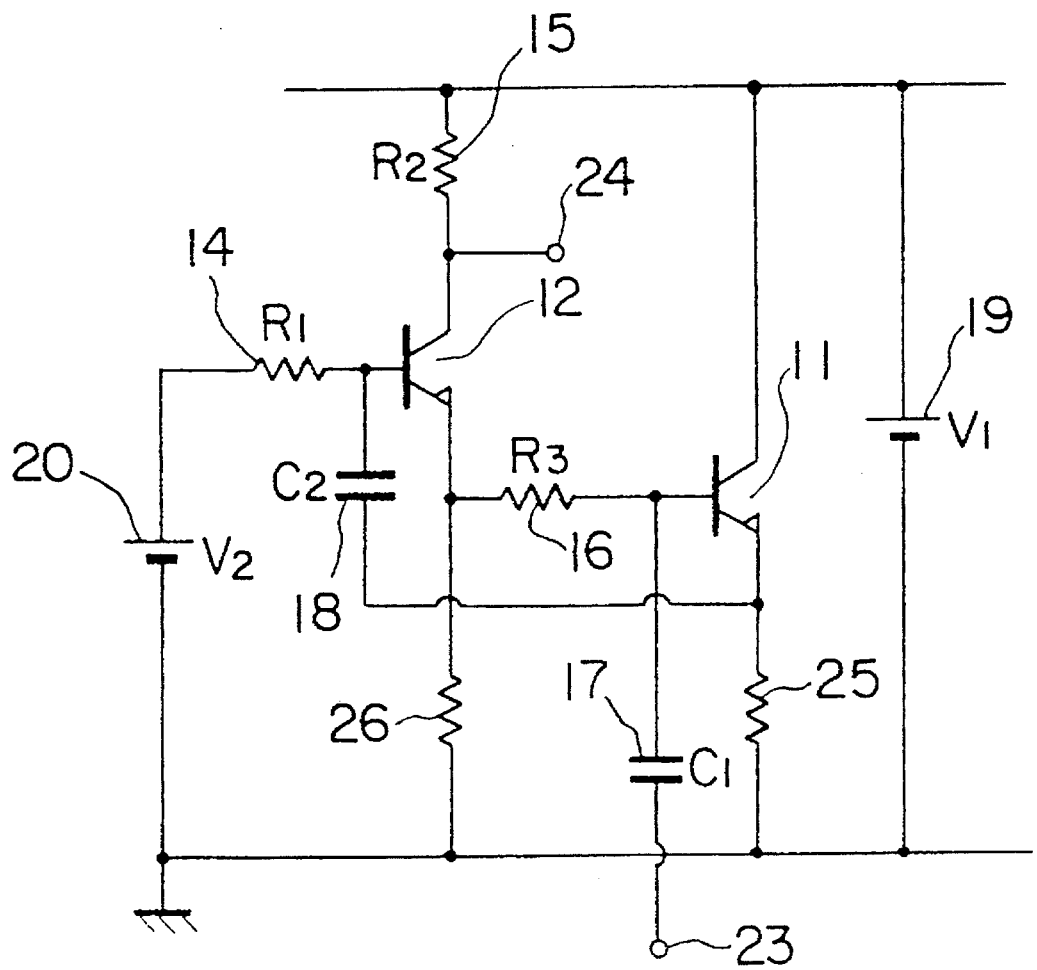
F I G. 3

ACTIVE BANDPASS FILTER

BACKGROUND OF THE INVENTION

The present invention relates to a bandpass filter which uses active elements, that is, to an active bandpass filter, and more particularly to an active bandpass filter with improved degree of freedom in setting quality factor Q and peak gain.

FIG. 1 is a schematic circuit diagram an example of the configuration of a conventional bandpass filter. In this drawing, an input terminal 31 which accepts an input signal $v_i$ is connected to one end of a capacitor 32, which has a capacitance value of $C_{31}$. The other end of the capacitor 32 is connected to one end of a resistor 33 which has a resistance value of $R_{31}$, and also to one end of a resistor 34 which has a resistance value of $R_{32}$. The other end of the resistor 33 is grounded. The other end of the resistor 34 is grounded through a capacitor 35 which has a capacitance value of $C_{32}$, and is also connected to an output terminal resistor 36 used to output an output signal $v_o$.

In a filter circuit such as described above, the transfer function G(b/a) is given by equation (1).

$$G\left(\frac{b}{a}\right) = \frac{\frac{1}{C_{32}R_{32}} s}{s^2 + \frac{C_{31}R_{31} + C_{32}R_{31} + C_{32}R_{32}}{C_{31}C_{32}R_{31}R_{32}} s + \frac{1}{C_{31}C_{32}R_{31}R_{32}}} \quad (1)$$

($s=j\omega$, $j=(-1)^{1/2}$, $\omega$:frequency)

The cutoff frequency $\omega_0$ is expressed by equation (2).

$$\omega_0 = \frac{1}{\sqrt{C_{31}C_{32}R_{31}R_{32}}} \quad (2)$$

The quality factor Q and the peak gain H are expressed by equation (3) and equation (4), respectively.

$$Q = \frac{\sqrt{C_{31}C_{32}R_{31}R_{32}}}{C_{31}R_{31} + C_{32}R_{31} + C_{32}R_{32}} \quad (3)$$

$$H = \frac{C_{31}R_{31}}{C_{31}R_{31} + C_{32}R_{31} + C_{32}R_{32}} \quad (4)$$

However, in a conventional bandpass filter, such as shown in FIG. 1, there is a shortcoming in that the quality factor Q cannot be set to a value of 0.5 or higher. Another shortcoming is that it is not possible to have a peak gain H of 1 or higher.

If the substitutions $C_{31}=nC_{32}$ and $R_{31}=mR_{32}$ (where n, m>0) are made in equation (2), the cutoff frequency $\omega_0$ is expressed as in equation (5), so that quality factor Q is expressed as in equation (6).

$$\omega_0 = \frac{1}{C_{32}R_{32}} \frac{1}{\sqrt{nm}} = \text{const} \quad (5)$$

$$Q = \frac{\sqrt{nm}}{1 + m + nm} \quad (6)$$

If we hold n constant and consider the maximum value of Q, it is seen by equation (7) that the value of Q is maximum when $m=1/(n+1)$.

$$\frac{\partial Q}{\partial m} = \frac{(nm+m+1)\left(\frac{1}{2}\sqrt{\frac{n}{m}}\right) - \sqrt{nm}\,(n+1)}{(nm+m+1)^2} \quad (7)$$

$$= \frac{\frac{1}{2}\sqrt{\frac{n}{m}}\,\{1 - m(n+1)\}}{(nm+m+1)^2}$$

If we let $Q_{max}$ be this maximum value of Q, this value is expressed as follows.

$$Q_{max} = \frac{1}{2} \sqrt{\frac{n}{n+1}} < \frac{1}{2} \quad (8)$$

Therefore, the value of Q cannot be 0.5 or higher.

Equation (4) can be rewritten in the form of equation (9). Since $C_{31}$, $C_{32}$, $R_{31}$, and $R_{32}$ are all larger than zero, it is impossible for the peak gain H to be 1 or higher.

$$H = 1 - \frac{C_{32}R_{31} + C_{32}R_{32}}{C_{31}R_{31} + C_{32}R_{31} + C_{32}R_{32}} \quad (9)$$

To achieve superior filter characteristics, it is desirable to have a waveform as the output signal $v_o$ that changes sharply with respect to frequency, that is, it is desirable that the value of Q be made large. Enabling the setting of the peak gain H to a value of 1 or higher is also advantageous from the standpoint of circuit design.

Japanese laid-open patent No. 1989-067015 discloses a filter in that the values of quality factor Q and peak gain can be made larger than those of the conventional filter described above. This filter, however, includes complicated transformer-conductance amplifiers (variable voltage-current converters). Further, Japanese laid-open patent No. 1994-283965 discloses an active filter without variable voltage-current converters. This filter, however, is not an active bandpass filter but an active lowpass filter.

SUMMARY OF THE INVENTION

The present invention has as an object the provision of an active bandpass filter of simple circuit configuration which offers free setting of the value of quality factor Q and peak gain.

The present invention provides an active bandpass filter having an input terminal and an output terminal, comprising: a first transistor having an emitter, a base connected to the input terminal via a first capacitance element, a collector connected to a first constant voltage source; first means for supplying a first constant current to the emitter of the first transistor; a second transistor having a base connected both to a second constant voltage source via a first resistance element and to the emitter of the first transistor via a second capacitance element, a collector connected both to the output terminal and, via a second resistance element, to the first constant voltage source, and an emitter connected to the base of the first transistor via a third resistance element; and second means for supplying a second constant current to the emitter of the second transistor.

The first and the second means may include a constant current source or a resistance element.

BRIEF DESCRIPTION OF THE DRAWINGS

FIG. 2 is a schematic circuit diagram which shows the configuration of a preferred embodiment of an active bandpass filter according to the present invention; and FIG. 3 is a schematic circuit diagram which shows the configuration of another preferred embodiment of an active bandpass filter according to the present invention.

DESCRIPTION OF THE PREFERRED EMBODIMENTS

Figure 1:
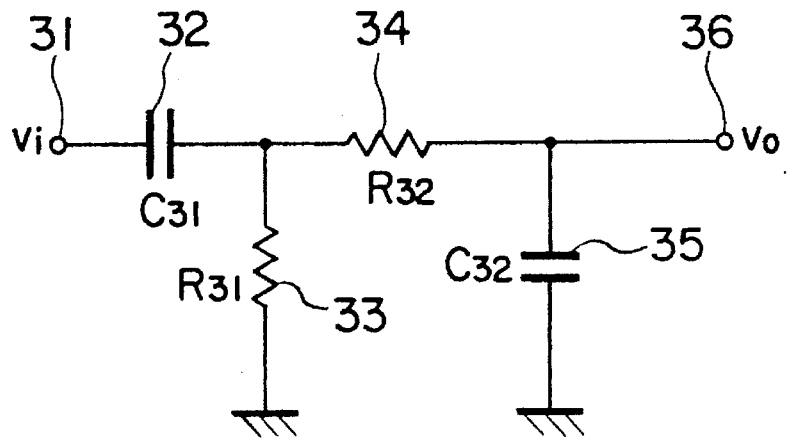
FIG. 1 is a schematic circuit diagram which shows an example of the configuration of a conventional bandpass filter.

An embodiment of the present invention will now be described, with reference made to the accompanying drawings.

FIG. 2 is a circuit diagram which shows the configuration of a preferred embodiment of an active bandpass filter according to the present invention.

As is shown in FIG. 2, the base of a first bipolar transistor 11 is connected to an input terminal 23 via a first capacitor 17 having a capacitance value of $C_1$. The collector of the transistor 11 is connected to a first voltage regulator 19 for supplying a constant voltage $V_1$ to the filter. In addition, the emitter of the transistor 11 is connected to a first constant current source 21 for supplying a first constant current $I_1$ to the transistor 11.

The base of a second bipolar transistor 12 is connected via a first resistor 14 having a resistance value of $R_1$ to a second voltage regulator 20 for supplying a second constant voltage $V_2$ to the filter and is also connected via a second capacitor 18 to the emitter of the transistor 11. The collector of the transistor 12 is connected to an output terminal 24 and also, via a second resistor 15 having a resistance value of $R_2$ to the voltage regulator 19. The emitter of the transistor 12 is connected via a third resistor 16 having a resistance value of $R_3$ to the base of the transistor 11 and is also connected to a second constant current source 22 for supplying a second constant current $I_2$ to the transistor 12.

In the active bandpass filter of FIG. 2, an input signal voltage $V_a$ at the input terminal 23, a base voltage $V_b$ of the transistor 11, a base voltage $V_c$ of the transistor 12 and an output signal voltage $V_d$ at the output terminal 25 are expressed by equations (10) through (12).

$$V_b = \frac{R_3}{R_3 + \frac{1}{sC_1}} V_a + \frac{\frac{1}{sC_1}}{R_3 + \frac{1}{sC_1}} V_c \qquad (10)$$

$$V_c = \frac{R_1}{R_1 + \frac{1}{sC_2}} \qquad (11)$$

$$V_d = (V_b - V_c)\frac{R_2}{R_3} = \frac{1}{1 + sC_2R_1} \cdot \frac{R_2}{R_3} V_b \qquad (12)$$

Additionally, by virtue of the equations (10) through (12), the overall transfer function G(d/a) of the active bandpass filter is given by equation (13).

$$G\left(\frac{d}{a}\right) = \frac{\frac{R_2}{C_2R_1R_3}s}{s^2 + \frac{1}{C_2R_1}s + \frac{1}{C_1C_2R_1R_3}} \qquad (13)$$

The cutoff frequency $\omega_0$ is expressed by equation (14).

$$\omega_0 = \frac{1}{\sqrt{C_1C_2R_1R_3}} \qquad (14)$$

The quality factor Q and peak gain H are given by equation (15) and equation (16), respectively.

$$Q = \sqrt{\frac{C_2R_1}{C_1R_3}} \qquad (15)$$

$$H = \frac{R_2}{R_3} \qquad (16)$$

If $C_2 = nC_1$, and $R_1 = mR_3$ (where n, m>0) are substituted into the above-noted equation (15), the cutoff frequency $\omega_0$ is expressed by equation (17), so that the quality factor Q is expressed by equation (18).

$$\omega_0 = \frac{1}{C_1R_3} \frac{1}{\sqrt{nm}} = \text{const} \qquad (17)$$

$$Q = \sqrt{nm} = \text{const} \qquad (18)$$

From equation (18), it can be seen that by appropriately selecting the values of n and m (that is, by appropriately selecting the capacitance values $C_1$ and $C_2$ of the capacitors 17 and 18 and the resistance values $R_1$, and $R_3$ of the resistance elements 14 and 16, respectively), it is possible to set the quality factor Q freely, without limitation. That is, in accordance with this preferred embodiment of the present invention, the limitation to a value of Q below 0.5, which is imposed in the conventional bandpass filter, is not imposed.

Furthermore, from the above-noted equation (16), by appropriately selecting the respective resistance values $R_2$ and $R_3$ of the resistance elements 15 and 16, it is possible to set the peak gain H freely, without limitation, so that the limitation to a value of peak gain less than 1, which is imposed in the conventional bandpass filter, is not imposed.

FIG. 3 is a schematic circuit diagram which shows another preferred embodiment of an active bandpass filter according to the present invention. In this figure, elements which are the same as shown in FIG. 2 are assigned the same reference numerals.

In the active bandpass filter shown in FIG. 3, the configuration differs from the configuration shown in FIG. 2 in that resistors 25 and 26 are used instead of the first and second constant current sources 21 and 22. It is further available to use the current source 21 (or 22) and the resistor 26 (or 25).

The cutoff frequency $\omega_0$, quality factor Q, and peak gain H given by equations (14) through (18) can be achieved even in the case in which resistors are used instead of constant current sources, enabling achievement of the desired effect of the present invention. As described in detail above, in accordance with the present invention, an active bandpass filter offering free setting of the values of quality factor Q and peak gain is provided.

What is claimed is:

1. An active bandpass filter having an input terminal and an output terminal, comprising:

a first transistor having an emitter, a base connected to the input terminal via a first capacitance element and a collector connected to a first constant voltage source;

first means for supplying a first constant current to the emitter of the first transistor;

a second transistor having a base connected both to a second constant voltage source via a first resistance element and to the emitter of the first transistor via a second capacitance element, a collector connected both to the output terminal and, via a second resistance element, to the first constant voltage source, and an emitter connected to the base of the first transistor via a third resistance element; and second means for supplying a second constant current to the emitter of the second transistor.

2. An active bandpass filter according to claim 1, wherein the first means includes a constant current source.

3. An active bandpass filter according to claim 1, wherein the first means includes a resistance element.

4. An active bandpass filter according to claim 1, wherein the second means includes a constant current source.

5. An active bandpass filter according to claim 1, wherein the second means includes a resistance element.

* * * * *